(12) United States Patent
Belveze et al.

(10) Patent No.: US 9,203,666 B2
(45) Date of Patent: Dec. 1, 2015

(54) IQ MISMATCH COMPENSATION

(71) Applicant: ST-Ericsson SA, Plan-les-Ouates (CH)

(72) Inventors: Fabrice Belveze, Claix (FR); Robin Gerzaguet, Gieres (FR)

(73) Assignee: ST-ERICSSON SA, Plan-Les-Ouates (CH)

( * ) Notice: Subject to any disclaimer, the term of this patent is extended or adjusted under 35 U.S.C. 154(b) by 0 days.

(21) Appl. No.: 14/390,507

(22) PCT Filed: Apr. 10, 2013

(86) PCT No.: PCT/EP2013/057445
§ 371 (c)(1),
(2) Date: Oct. 3, 2014

(87) PCT Pub. No.: WO2013/153087
PCT Pub. Date: Oct. 17, 2013

(65) Prior Publication Data
US 2015/0172082 A1    Jun. 18, 2015

Related U.S. Application Data

(60) Provisional application No. 61/624,526, filed on Apr. 16, 2012.

(30) Foreign Application Priority Data

Apr. 10, 2012 (EP) ..................................... 12163662

(51) Int. Cl.
*H04L 27/152* (2006.01)
*H04B 1/12* (2006.01)
(Continued)

(52) U.S. Cl.
CPC ............ *H04L 27/1525* (2013.01); *H03D 3/009* (2013.01); *H04B 1/123* (2013.01); *H04L 27/3863* (2013.01)

(58) Field of Classification Search
CPC .......... H03D 3/009; H03D 2200/0045; H03D 2200/0082; H04L 27/3863; H04B 1/123
See application file for complete search history.

(56) References Cited

U.S. PATENT DOCUMENTS 5,705,949 A * 1/1998 Alelyunas et al. ............. 329/304
6,987,815 B2 * 1/2006 Denno .......................... 375/316
(Continued)

OTHER PUBLICATIONS

International Search Report issued in corresponding International Application No. PCT/EP2013/057445, date of mailing Jun. 3, 2013.
(Continued)

*Primary Examiner* — Sophia Vlahos
(74) *Attorney, Agent, or Firm* — Patent Portfolio Builders PLLC

(57) ABSTRACT

A receiver (100) has an In-phase path (I-path) (101) that delivers a digital I-path signal $x_I(t)$ and a Quadrature path (Q-path) (103) that delivers a digital Q-path signal $x_Q(t)$. The receiver (100) includes a compensation stage (124) arranged to compensate for gain error g and phase error $\phi$ between the digital I-path signal $x_I(t)$ and the digital Q-path signal $x_Q(t)$. The compensation stage (124) has a compensation coefficient generation stage (200), a compensation coefficient application stage (202), a gain control stage (208), a relative gradient generation stage (214) and a step parameter generation stage (224). Compensation coefficients $W_{1,1}$, $W_{1,2}$, $W_{2,1}$, $W_{2,2}$ applied to the digital I-path signal $x_I(t)$ and the digital Q-path signal $x_Q(t)$ are generated by iteratively updating them using a relative gradient of the compensated digital in-phase signal $y_I(t)$ and a compensated digital quadrature signal $y_Q(t)$, and a step parameter $\mu_n$, the magnitude of which is adjusted based on a rate of change of the compensation coefficients $W_{1,1}$, $W_{1,2}$, $W_{2,1}$, $W_{2,2}$.

14 Claims, 3 Drawing Sheets

(51) Int. Cl.
*H03D 3/00* (2006.01)
*H04L 27/38* (2006.01)

(56) References Cited

U.S. PATENT DOCUMENTS

| | | | |
|---|---|---|---|
| 8,644,522 B2* | 2/2014 | LeBlanc et al. | 381/71.12 |
| 8,654,885 B2* | 2/2014 | Lee et al. | 375/295 |
| 8,792,591 B1* | 7/2014 | Lee | 375/324 |
| 2002/0097812 A1* | 7/2002 | Wiss | 375/316 |
| 2006/0291590 A1* | 12/2006 | Elahi et al. | 375/332 |
| 2007/0076827 A1* | 4/2007 | Beamish et al. | 375/345 |
| 2008/0025381 A1* | 1/2008 | Lee et al. | 375/219 |
| 2009/0147886 A1 | 6/2009 | Astrom et al. | |
| 2011/0182388 A1 | 7/2011 | Kim et al. | |

OTHER PUBLICATIONS

Written Opinion of the International Searching Authority issued in corresponding International Application No. PCT/EP2013/057445, date of mailing Jun. 3, 2013.

Extended European Search Report issued in corresponding European application No. EP 12 16 3662, date of completion Jul. 9, 2012.

M. Valkama, et al.; "Blind I/Q Signal Separation-Based Solutions for Receiver Signal Processing"; ERUASIP Journal on Applied Signal Processing; Sep. 21, 2005; pp. 2708-2718.

* cited by examiner

US 9,203,666 B2

IQ MISMATCH COMPENSATION

TECHNICAL FIELD

The disclosure relates to a receiver having a compensation stage that compensates for phase and gain errors, or mismatches, between in-phase (I) and quadrature (Q) signal paths of the receiver, and to a method of receiving a signal incorporating such compensation.

BACKGROUND

Radio Frequency (RF) receivers of the Zero Intermediate Frequency (Zero-IF) and Low Intermediate Frequency (Low-IF) type have a first signal path for an In-phase (I) signal and a second signal path for a Quadradure (Q) signal. A received signal is mixed with a Local Oscillator (LO) signal to generate the I signal and with the same LO signal shifted in phase by 90° to generate the Q signal, but in all other respects the signal paths should be the same. Unfortunately, in a real receiver, it is very difficult to ensure that the phase shift is exactly 90°. It is also inevitable that there are differences between the components of the first and second paths that lead to variations in the delay and gain experienced by the signals along the signal paths. This problem is generally referred to as "IQ mismatch".

In general, in an integrated circuit (IC), any difference in delay along the signal paths is not very large, and this causes less of a problem than variations in the gain and phase shift. However, the variations in gain and phase shift lead to distortion of the I and Q signals, creating additional noise and limiting reception performance.

Various ways of compensating for IQ mismatches have been proposed. For example, the IQ mismatches can be estimated and corrections applied to the I signal and the Q signal based on the estimates. In other methods, the IQ mismatches can be treated as noise or interference and steps taken to cancel this from the signals. However, no existing method is ideal. In particular, some methods perform well for relatively low mismatches, but less well for higher mismatches. Indeed, some such methods can fail altogether when mismatches reach a certain level. Other methods react too slowly to deal with fast changes in the IQ mismatches.

The paper "Blind IQ Signal Separation-Based Solutions for Receiver Signal Processing", Valkama et al, EURASIP Journal on Applied Signal Processing, 1 Jan. 2005, pp 2708-2718 describes a technique for compensating for IQ mismatches that uses Blind Signal Separation (BSS). BSS avoids the need for training signals, and instead relies on analysing the I and Q signals themselves as a radio signal is received. However, the technique described in this paper does not cope well when IQ mismatches change quickly.

There is therefore a need for improved IQ mismatch compensation.

SUMMARY

According to a first aspect, there is provided a receiver for receiving a signal, the receiver comprising:
a local oscillator arranged to deliver an in-phase local oscillator signal and a quadrature local oscillator signal;
an in-phase signal path having a mixer arranged to mix the signal received by the receiver with the in-phase local oscillator signal to deliver an in-phase signal, and an analogue-to-digital converter arranged convert the in-phase signal to a digital in-phase signal; and a quadrature signal path having a mixer arranged to mix the signal received by the receiver with the quadrature local oscillator signal to deliver a quadrature signal, and an analogue-to-digital converter arranged convert the quadrature signal to a digital quadrature signal;
a compensation stage arranged deliver a compensated digital in-phase signal and a compensated digital quadrature signal by applying compensation coefficients to the digital in-phase signal and the digital quadrature signal; and
a compensation coefficient generator arranged to generate the compensation coefficients by iteratively updating them using a relative gradient of the compensated digital in-phase signal and the compensated digital quadrature signal, and a step parameter,
wherein the compensation stage adjusts the magnitude of the step parameter based on the rate of change of the compensation coefficients.

According to a second aspect, there is provided a method comprising:
receiving a signal;
delivering an in-phase local oscillator signal and a quadrature local oscillator signal;
in an in-phase signal path, mixing the received signal with the in-phase local oscillator signal to deliver an in-phase signal and converting the in-phase signal to a digital in-phase signal; and
in a quadrature signal path, mixing the received signal with the quadrature local oscillator signal to deliver a quadrature signal and converting the quadrature signal to a digital quadrature signal;
applying compensation coefficients to the digital in-phase signal and the digital quadrature signal to deliver a compensated digital in-phase signal and a compensated digital quadrature signal;
generating the compensation coefficients by iteratively updating them using a relative gradient of the compensated digital in-phase signal and the compensated digital quadrature signal, and a step parameter;
and adjusting the magnitude of the step parameter based on the rate of change of the compensation coefficients.

Because the compensation coefficients are generated by iteratively updating them using a relative gradient of the compensated digital in-phase signal and the compensated digital quadrature signal, the generation may be considered to be a Blind Source Separation (BSS) technique. In other words, generation need not rely directly on information about IQ mismatches, but rather may seek to optimise the compensation coefficients based the compensated digital in-phase signal and the compensated digital quadrature signal they produce. This technique is able to deal with large IQ mismatches without difficulty.

Adjusting the magnitude of the step parameter based on the rate of change of the compensation coefficients can provide adaptivity. For example, if the compensation coefficients are changing quickly, the step size can increase, and if the compensation coefficients are changing slowly, the step size can decrease. This allows the compensation stage to respond to fast and slow changes in IQ mismatches effectively.

The compensation stage may be arranged to adjust the magnitude of the step parameter based on the rate of change of the compensation coefficients with the magnitude of the step parameter. Likewise, the method may include adjusting the magnitude of the step parameter based on the rate of change of the compensation coefficients with the magnitude of the step parameter. By looking at the rate of change of the compensation coefficients with the magnitude of the step parameter, it is possible to ensure that the compensation coefficients do not change too quickly.

The compensation stage may be arranged to adjust the magnitude of the step parameter based on the relative gradient of the compensated digital in-phase signal and the compensated digital quadrature signal. Likewise, the method may include adjusting the magnitude of the step parameter based on the relative gradient of the compensated digital in-phase signal and the compensated digital quadrature signal. This allows the magnitude of the step parameter to be adjusted quickly and efficiently. It also helps to ensure that compensation stage reacts quickly to changes in IQ mismatches and can cope with a large range of IQ mismatches.

The compensation stage may be arranged to adjust the magnitude of the step parameter based on a trace function of a first matrix of the rate of change of the compensation coefficients with the magnitude of the step parameter and a second matrix of the relative gradient of the compensated digital in-phase signal and the compensated digital quadrature signal. Likewise, the method may include adjusting the magnitude of the step parameter based on a trace function of a first matrix of the rate of change of the compensation coefficients with the magnitude of the step parameter and a second matrix of the relative gradient of the compensated digital in-phase signal and the compensated digital quadrature signal.

In one example, the magnitude of the step parameter may be adjusted based on $$\mu_n = \mu_{n-1}(\alpha - \beta \mathrm{trace}(H_n G_n))$$

where $\mu_{n-1}$ is the magnitude of the step parameter, $\mu_n$ is the adjusted magnitude of the step parameter, $G_n$ is the first matrix, $H_n$ is the second matrix and $\alpha$ and $\beta$ are constants.

In another example, the magnitude of the step parameter may be adjusted based on $$\mu_n = \mu_{n-1} + \beta(\eta - \gamma \mu_{n-1})$$

where $$\eta = \mu_{n-1}(\mu_{n-1} - \alpha \mathrm{trace}(H_n G_n))$$

$\mu_{n-1}$ is the magnitude of the step parameter, $\mu_n$ is the adjusted magnitude of the step parameter, $G_n$ is the first matrix, $H_n$ is the second matrix and $\alpha$, $\beta$ and $\gamma$ are constants.

The receiver may further comprise a gain controller arranged to generate a gain control parameter and a relative gradient generation stage arranged to generate the relative gradient based on the gain control parameter, the compensated digital in-phase signal and the compensated digital quadrature signal. Likewise, the method may comprise generating a gain control parameter, and generating the relative gradient based on the gain control parameter, the compensated digital in-phase signal and a compensated digital quadrature signal. In one example, the relative gradient is generated based on $$H_n = c_n Y_n \cdot Y_n^t - I_2$$

where $H_n$ is a relative gradient matrix, $c_n$ is the gain control parameter, $Y_n$ is a matrix of the compensated digital in-phase signal and the compensated digital quadrature signal at a time n, $Y_n^t$ is the transpose of $Y_n$ and $I_2$ is an identity matrix.

The gain controller may be arranged to generate the gain control parameter based on the uncompensated digital in-phase signal and the uncompensated digital quadrature signal. Likewise, the method may comprise generating the gain control parameter based on the uncompensated digital in-phase signal and the uncompensated digital quadrature signal. The gain control parameter typically has a value that normalises the compensated digital in-phase signal and the compensated digital quadrature signal. In one example, the gain control parameter is generated based on $$c_n = 2^{-b_n}$$

where $b_n$ is a gain control value defined by $$b_n = \mathrm{round}(\log_2 a_n)$$

and $a_n$ is another gain control value defined by $$a_n = a_{n-1} + \lambda(\|X_n\|^2 - a_{n-1})$$

where $X_n$ is a matrix of the uncompensated digital in-phase signal and the uncompensated digital quadrature signal at time n, $\|\ \|$ denotes a norm and $\lambda$ is a smoothing factor.

The compensation coefficients may comprise a first compensation coefficient, a second compensation coefficient, a third compensation coefficient and a fourth compensation coefficient. The compensation stage may be arranged to generate a first signal and a third signal by multiplying the digital in-phase signal with the first compensation coefficient and the third compensation coefficient respectively, to generate a second signal and a fourth signal by multiplying the digital quadrature signal with the second compensation coefficient and the fourth compensation coefficient respectively, to sum the first signal and the second signal to output the compensated digital in-phase signal, and to sum the third signal and the fourth signal to output the compensated digital quadrature signal. Likewise, the method may comprise generating a first signal and a third signal by multiplying the digital in-phase signal with the first compensation coefficient and the third compensation coefficient respectively, generating a second signal and a fourth signal by multiplying the digital quadrature signal with the second compensation coefficient and the fourth compensation coefficient respectively, summing the first signal and the second signal to output the compensated digital in-phase signal, and summing the third signal and the fourth signal to output the compensated digital quadrature signal.

Although the disclosure has been described above with reference to different components, such as a compensation stage and a compensation coefficient generator, these components need not necessarily be physically distinct. One or more of the components may be implemented in a processor, such as a Digital Signal Processor (DSP), and two or more such components may be implemented in the same processor.

Similarly, the method can be implemented using computer software and, according to a further aspect, there is provided computer software or computer program code adapted to carry out the method described above when processed by a computer or a processor. The computer software or computer program code can be carried by a computer readable medium. The medium may be a physical storage medium such as a Read Only Memory (ROM) chip. Alternatively, it may be a disk such as a Digital Video Disk (DVD-ROM) or Compact Disk (CD-ROM). It could also be a signal such as an electronic signal over wires, an optical signal or a radio signal. The disclosure extends to a computer or to a processor running the software or code, e.g. a computer configured to carry out the method described above.

Embodiments of the disclosure are described below, with reference to the accompanying drawings, by way of example only.

DETAILED DESCRIPTION

Figure 1:
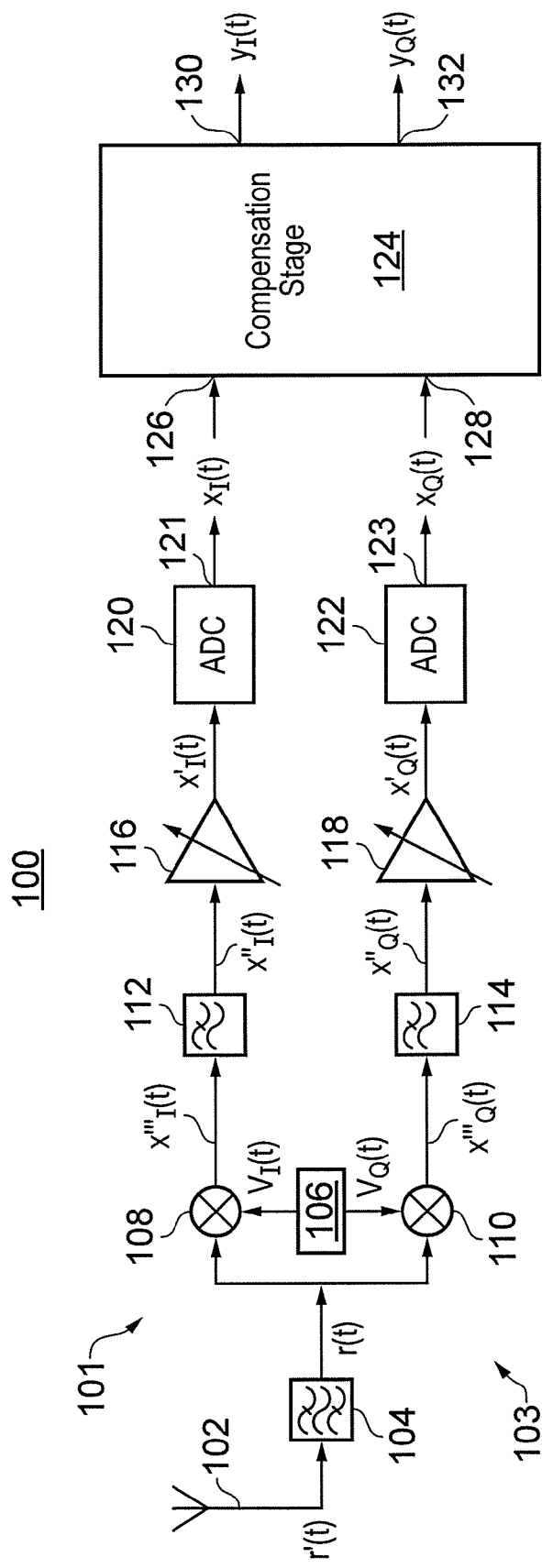
FIG. 1 is a schematic illustration of a receiver according to an embodiment of the disclosure.

Referring to FIG. 1, according to one embodiment of the disclosure there is provided a receiver 100. The receiver 100 is a Radio Frequency (RF) receiver 100 in the sense that it is arranged to receive an RF signal r'(t). The receiver 100 has an antenna 102 at which the RF signal r'(t) is received. A filter 104, which is usually a band pass filter, is coupled to the antenna 102 and arranged to filter the RF signal r'(t) received at the antenna 102 to output a filtered RF signal r(t).

The receiver 100 has an In-phase path (I-path) 101 and a Quadrature path (Q-path) 103. More specifically, the receiver 100 has a local oscillator (LO) generator 106 for generating an I-path LO signal $v_I(t)$ and a Q-path LO signal $v_Q(t)$. The I-path LO signal $v_I(t)$ and the Q-path LO signal $v_Q(t)$ have the same LO frequency, but the phase of the Q-path LO signal $v_Q(t)$ is shifted by 90° with respect to the phase of the I-path LO signal $v_I(t)$. An I-path multiplier 108 multiplies the filtered RF signal r(t) with the I-path LO signal $v_I(t)$ to output an I-path signal $x_I'''(t)$ and a Q-path multiplier 110 multiplies the filtered RF signal r(t) with the Q-path LO signal $v_Q(t)$ to output a Q-path signal $x_Q'''(t)$. In this embodiment, the LO frequency is the same as a carrier frequency of the received RF signal r'(t). This means that the I-path signal $x_I'''(t)$ and the Q-path signal $x_Q'''(t)$ are baseband signals and the receiver 100 is of a type known as a Zero Intermediate Frequency (Zero-IF) receiver. However, the disclosure is equally applicable to embodiments in which the LO frequency is slightly lower than the carrier frequency of the received RF signal r'(t), meaning that the I-path signal $x_I'''(t)$ and the Q-path signal $x_Q'''(t)$ are close to baseband and the receiver 100 is of a type known as a Low Intermediate Frequency (Low-IF) receiver.

In the I-path 101, an I-path filter 112 is coupled to an output of the I-path multiplier 108 and arranged to filter the I-path signal $x_I'''(t)$ to output a filtered I-path signal $x_I''(t)$; an I-path amplifier 116 is coupled to an output of the I-path filter 112 and arranged to amplify the filtered I-path signal $x_I''(t)$ to output an amplified I-path signal $x_I'(t)$; and an I-path Analogue-to-Digital Converter (ADC) 120 is coupled to an output of the I-path amplifier 116 to convert the amplified I-path signal $x_I'(t)$ to a digital I-path signal $x_I(t)$. Correspondingly, in the Q-path 103, a Q-path filter 114 is coupled to an output of the Q-path multiplier 110 and arranged to filter the Q-path signal $x_Q'''(t)$ to output a filtered Q-path signal $x_Q''(t)$; a Q-path amplifier 118 is coupled to an output of the Q-path filter 114 and arranged to amplify the filtered Q-path signal $x_Q''(t)$ to output an amplified Q-path signal $x_Q'(t)$; and a Q-path ADC 122 is coupled to an output of the Q-path amplifier 118 to convert the amplified Q-path signal $x_Q'(t)$ to a digital Q-path signal $x_Q(t)$. In this embodiment, the I-path filter 112 and the Q-path filter 114 are low pass filters.

Due to inevitable imperfections in the structure of the receiver 100, it is difficult to ensure that the phase of the Q-path LO signal $v_Q(t)$ is shifted with respect to the phase of the I-path LO signal $v_I(t)$ by exactly 90°, leading to the digital Q-path signal $x_Q(t)$ having an error component. The inaccuracy of the phase shift can be defined as a phase error φ in the Q-path LO signal $v_Q(t)$ with respect to the I-path LO signal $v_I(t)$ shifted by exactly 90°. It is similarly difficult to ensure that the gain applied along the I-path 101 and the gain applied along the Q-path 103 are the same. This results in a gain error g in the form of a ratio of the gain of the Q-path 103 to the gain of the I-path 101. In an ideal receiver 100, the phase error φ is zero, i.e. φ=0, and the gain error g is unity, i.e. g=1, but in a real receiver 100 this does not hold true.

In this embodiment, the I-path amplifier 116 and the Q-path amplifier 118 have variable gain, with the gain of the amplifiers 116, 118 being changed from time to time. This is useful for allowing the receiver 100 to handle variations in the strength of the received RF signal r'(t), as well as changes in noise and interference. However, the variable gain of the amplifiers 116, 118 can cause the variations in the gain error g. In particular, where the I-path amplifier 116 and the Q-path amplifier 118 are each implemented as two or more amplifiers with fixed gain that can be selectively coupled in I-path or Q-path respectively to provide a variable cumulative gain, coupling and decoupling one or more of the fixed gain amplifiers can cause step changes in the gain error g.

In order to deal with the gain error g and the phase error φ in the digital I-path signal $x_I(t)$ and the digital Q-path signal $x_Q(t)$, the receiver 100 includes a compensation stage 124. The compensation stage is arranged to compensate for the gain error g and the phase error φ. A first input 126 of the compensation stage 124 is coupled to an output 121 of the I-path ADC 120 so as to receive the digital I-path signal $x_I(t)$, and a second input 128 of the compensation stage 124 is coupled to an output 123 of the Q-path ADC 122 so as to receive the digital Q-path signal $x_Q(t)$. The compensation stage 124 delivers a compensated digital I-path signal $y_I(t)$ at a first output 130 and a compensated digital Q-path signal $y_Q(t)$ at a second output 132.

Figure 2:
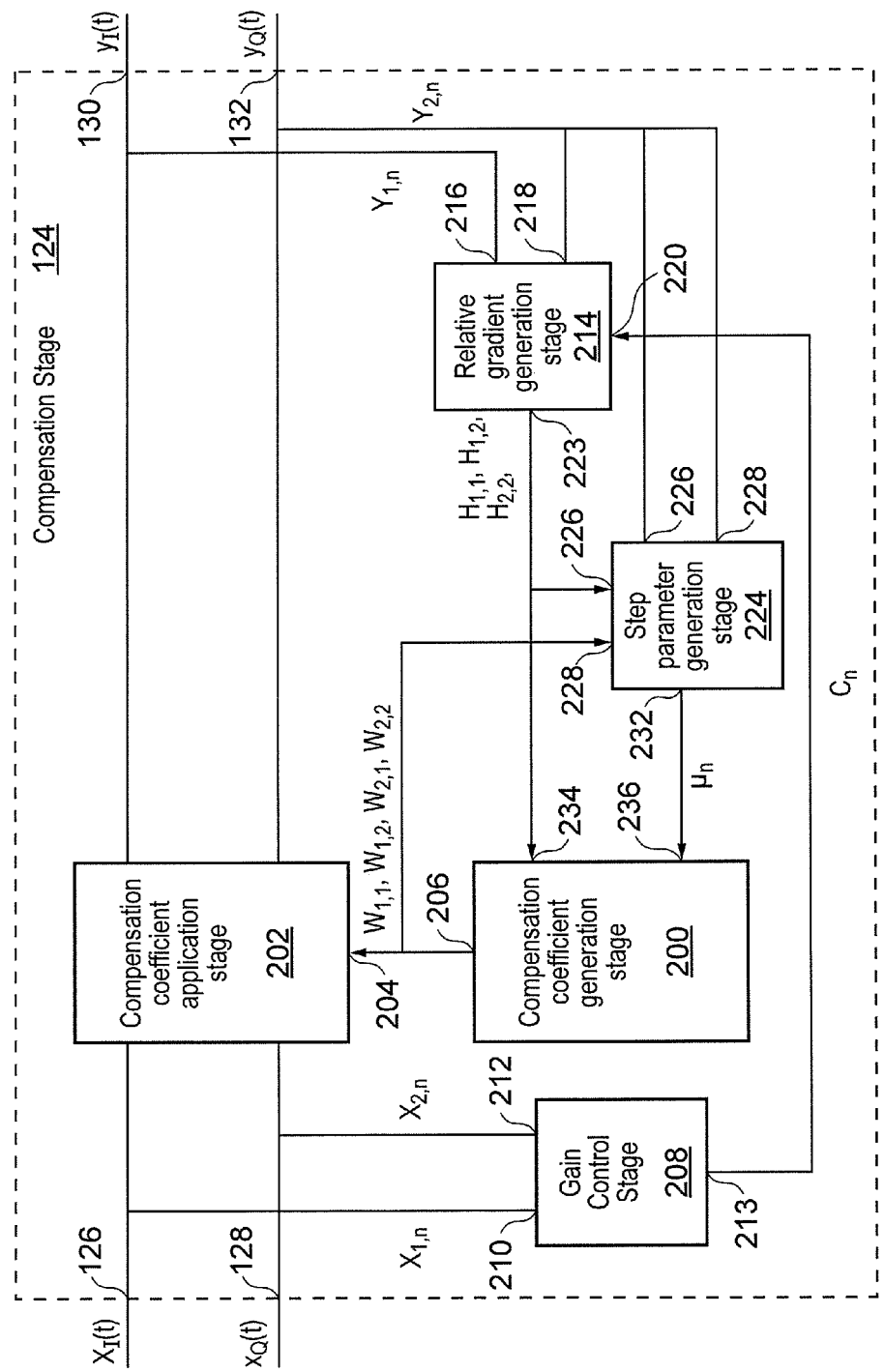
FIG. 2 is a schematic illustration of a compensation stage of the receiver shown in FIG. 1.

Referring to FIG. 2, the compensation stage 124 has a compensation coefficient generation stage 200, a compensation coefficient application stage 202, a gain control stage 208, a relative gradient generation stage 214 and a step parameter generation stage 224.

The compensation coefficient generation stage 200 is arranged to generate a first compensation coefficient $W_{1,1}$, a second compensation coefficient $W_{1,2}$, a third compensation coefficient $W_{2,1}$ and a fourth compensation coefficient $W_{2,2}$, and to deliver them to the output 206. An input 204 of the compensation coefficient application stage 202 is coupled to an output 206 of the compensation coefficient generation stage 200 so as to receive the first, second, third and fourth compensation coefficients $W_{1,1}$, $W_{1,2}$, $W_{2,1}$, $W_{2,2}$ from the compensation coefficient generation stage 200. The compensation coefficient application stage 202 is arranged to apply the first, second, third and fourth compensation coefficients $W_{1,1}$, $W_{1,2}$, $W_{2,1}$, $W_{2,2}$ to the digital I-path signal $x_I(t)$ and the digital Q-path signal $x_Q(t)$ to deliver the compensated digital I-path signal $y_I(t)$ and the compensated digital Q-path signal $y_Q(t)$.

Figure 3:
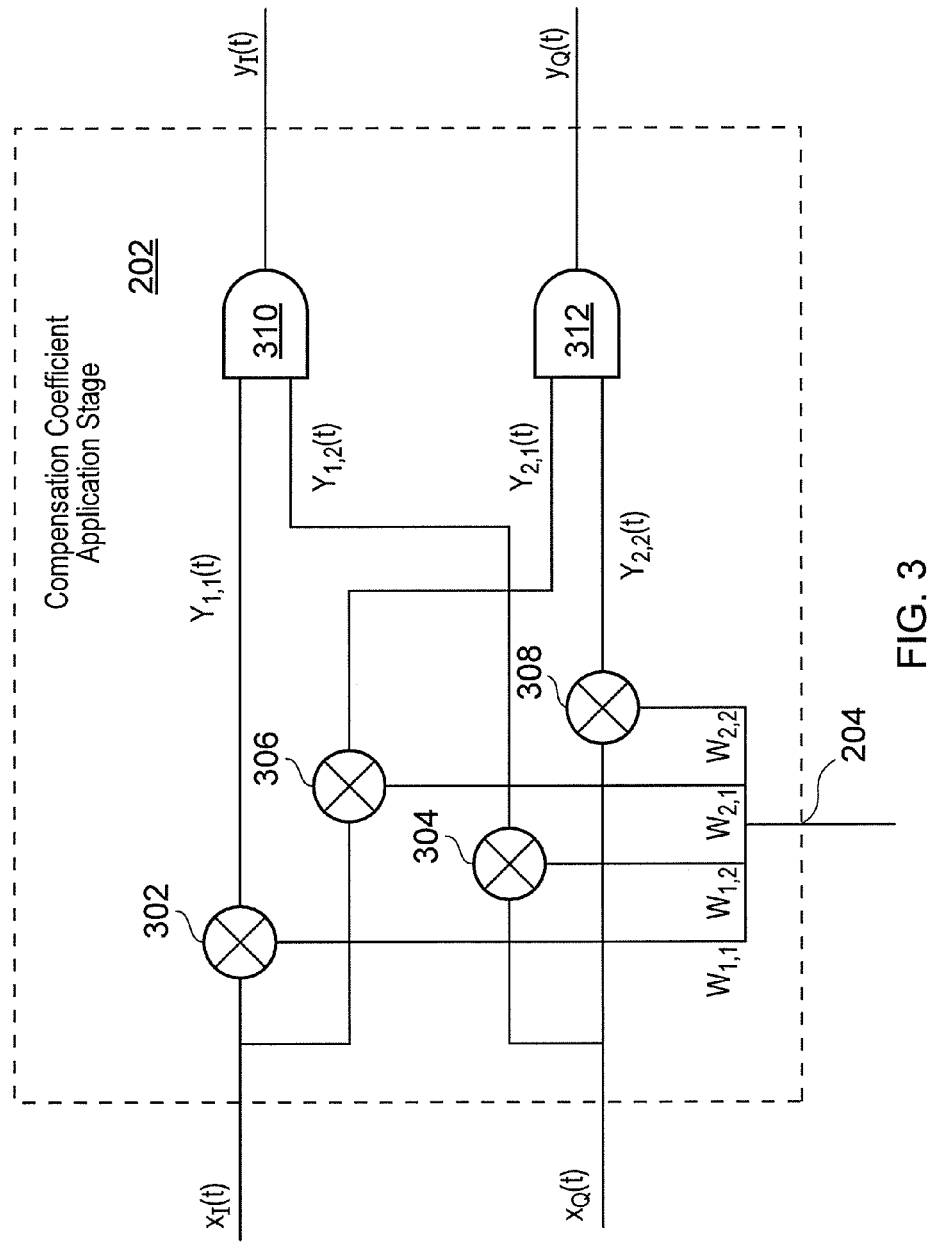
FIG. 3 is a schematic illustration of a compensation coefficient application stage of the compensation stage shown in FIG. 2.

Referring to FIG. 3, in more detail, the compensation coefficient application stage 202 has a first multiplier 302 for multiplying the digital I-path signal $x_I(t)$ by the first compensation coefficient $W_{1,1}$ to generate a first signal $y_{1,1}(t)$; a second multiplier 304 for multiplying the digital Q-path signal $x_Q(t)$ by the second compensation coefficient $W_{1,2}$ to generate a second signal $y_{1,2}(t)$; a third multiplier 306 for multiplying the digital I-path signal $x_I(t)$ by the third compensation coefficient $W_{2,1}$ to generate a third signal $y_{2,1}(t)$; and a fourth multiplier 308 for multiplying the digital Q-path signal $x_Q(t)$ by the fourth compensation coefficient $W_{2,2}$ to generate a fourth signal $y_{2,2}(t)$. The coefficient application stage 202 also has a first summing stage 310 for summing the first signal $y_{1,1}(t)$ and the second signal $y_{1,2}(t)$ to generate the compensated digital I-path signal $y_I(t)$, and a second summing stage 312 for summing the third signal $y_{2,1}(t)$ and the fourth signal $y_{2,2}(t)$ to generate the compensated digital Q-path signal $y_Q(t)$. This can be expressed mathematically as $$y_I(t) = W_{1,1} \cdot x_I(t) + W_{1,2} \cdot x_Q(t)$$

$$y_Q(t) = W_{2,1} \cdot x_I(t) + W_{2,2} \cdot x_Q(t) \quad (1)$$

The gain control stage 208 of the compensation stage 124 has a first input 210 arranged receive the digital I-path signal $x_I(t)$ and a second input 212 arranged to receive the digital Q-path signal $x_Q(t)$. The gain control stage 214 uses a level $X_{1,n}$ of the digital I-path signal $x_I(t)$ at a time n and a level $X_{2,n}$ of the digital Q-path signal $x_Q(t)$ at the time n to determine a gain control parameter $c_n$, and deliver it to an output 213.

The relative gradient generation stage 214 has a first input 216 arranged to receive the compensated digital I-path signal $y_I(t)$, a second input 218 arranged to receive the compensated digital Q-path signal $y_Q(t)$, and a third input 220 coupled to the output 213 of the gain control stage 208 so as to receive the gain control parameter $c_n$. The relative gradient generation stage 214 uses a level $Y_{1,n}$ of the compensated digital I-path signal $y_I(t)$ at the time n, a level $Y_{2,n}$ of the compensated digital Q-path signal $y_Q(t)$ at the time n, and the gain control parameter $c_n$ to determine first, second and fourth relative gradient coefficients $H_{1,1}, H_{1,2}, H_{2,2}$, and to deliver them to an output 223.

The step parameter generation stage 224 has a first input 226 coupled to the output 223 of the relative gradient generation stage 214 so as to receive the first, second and fourth relative gradient coefficients $H_{1,1}, H_{1,2}, H_{2,2}$ and a second input 228 coupled to the output 206 of the compensation coefficient generation stage 200 so as to receive the first, second, third and fourth compensation coefficients $W_{1,1}, W_{1,2}, W_{2,1}, W_{2,2}$. The step function generation stage 224 determines a step parameter $\mu_n$ for the time n using the first, second and fourth relative gradient coefficients $H_{1,1}, H_{1,2}, H_{2,2}$, the first, second, third and fourth compensation coefficients $W_{1,1}, W_{1,2}, W_{2,1}, W_{2,2}$ and a step parameter $\mu_{n-1}$ determined for the preceding time n−1 and delivers the step parameter $\mu_n$ determined for the time n to an output 232.

The compensation coefficient generation stage 200 has a first input 234 coupled to the output 223 of the relative gradient generation stage 214 so as to receive the first, second and fourth relative gradient coefficients $H_{1,1}, H_{1,2}, H_{2,2}$ and a second input 236 coupled to the output 232 of the step parameter generation stage 224 so as to receive the step parameter $\mu_n$. The compensation coefficient generation stage 200 is arranged to generate the first, second, third and fourth compensation coefficients $W_{1,1}, W_{1,2}, W_{2,1}, W_{2,2}$ for the time n based on the first, second, third and fourth compensation coefficients $W_{1,1}, W_{1,2}, W_{2,1}, W_{2,2}$ for the preceding time n−1, the first, second and fourth relative gradient coefficients $H_{1,1}, H_{1,2}, H_{2,2}$ and the step parameter $\mu_n$.

In order to explain the operation of the compensation stage 124, it is useful to define an ideal digital I-path signal $z_I(t)$ and an ideal digital Q-path signal $z_Q(t)$ when the phase error $\phi$ and the gain error g are perfectly compensated for by the compensation stage 124. The relationship between the actual digital I-path and Q-path signals $x_I(t), x_Q(t)$ of the receiver 100 and the ideal digital I-path and Q-path signals $z_I(t), z_Q(t)$ can be expressed as $$\begin{bmatrix} x_I(t) \\ x_Q(t) \end{bmatrix} = \begin{bmatrix} 1 & 0 \\ -g\sin\phi & g\cos\phi \end{bmatrix} \begin{bmatrix} z_I(t) \\ z_Q(t) \end{bmatrix} \quad (2)$$

It is evident from equation (2) that the phase error $\phi$ and/or the gain error g having non-ideal values causes a component of the ideal digital I-path signal $z_I(t)$ to be present in the real digital Q-path signal $x_Q(t)$. Moreover, the ideal digital I-path signal $z_I(t)$ and the ideal digital Q-path signal $z_Q(t)$ are orthogonal to one another, and the unwanted components in the real digital Q-path signal $x_Q(t)$ comprise an undesired correlation between these signals.

The compensated digital I-path signal $y_I(t)$ at the first output 130 of the compensation stage 124 and the compensated digital Q-path signal $y_Q(t)$ at the second output 132 of the compensation stage 124 are estimates of the ideal digital I-path signal $z_I(t)$ and the ideal digital Q-path signal $z_Q(t)$. The purpose of the compensation stage 124 is to ensure that the compensated digital I-path signal $y_I(t)$ and the compensated digital Q-path signal $y_Q(t)$ are the best possible estimates of the ideal digital I-path signal $z_I(t)$ and the ideal digital Q-path signal $z_Q(t)$.

Defining an uncompensated signal matrix $X_n$ for a time n, in the form $$X_n = \begin{bmatrix} X_{1,n} \\ X_{2,n} \end{bmatrix},$$

a compensated signal matrix $Y_n$ for the time n, in the form $$Y_n = \begin{bmatrix} Y_{1,n} \\ Y_{2,n} \end{bmatrix},$$

can be defined as $$Y_n = W_{n-1} X_n \quad (3)$$

where $W_{n-1}$ is a compensation matrix of the first, second, third and fourth compensation coefficients $W_{1,1}, W_{1,2}, W_{2,1}$ and $W_{2,2}$, in the form $$W_{n-1} = \begin{bmatrix} W_{1,1} & W_{1,2} \\ W_{2,1} & W_{2,2} \end{bmatrix},$$

generated by the composition coefficient generation stage 200 for a preceding time n−1. Moreover, by defining a relative gradient matrix $H_n$, in the form $$H_n = \begin{bmatrix} H_{1,1} & H_{1,2} \\ H_{2,1} & H_{2,2} \end{bmatrix},$$

generation of the first, second, third and fourth compensation coefficients $W_{1,1}, W_{1,2}, W_{2,1}$ and $W_{2,2}$ for the time n by the compensation coefficient generation stage 200 can be defined as $$W_n = (I_2 - \mu_{n-1} H_n) W_{n-1} \quad (4)$$

where $I_2$ is the identity matrix of size two by two. In other words, the step parameter $\mu_{n-1}$ for the preceding time n−1 and the relative gradient matrix $H_n$ are used to update the compensation matrix $W_n$.

The relative gradient generation stage 214 generates the relative gradient matrix $H_n$ for the time n using $$H_n = c_n Y_n Y_n^t - I_2 \qquad (5)$$

It can be seen that the relative gradient matrix $H_n$ depends on the compensated signal matrix $Y_n$, but not on the uncompensated signal matrix $X_n$, or, indeed, information about the ideal digital I-path and Q-path signals $z_I(t)$, $z_Q(t)$. Moreover, because the relative gradient matrix $H_n$ is based on a multiplication of the compensated signal matrix $Y_n$ with its transpose $Y_n^t$, the relative gradient matrix $H_n$ identifies any correlation or gain mismatch between the digital I-path signal $x_I(t)$ and Q-path signals $x_I(t)$, and minimisation of the relative gradient matrix $H_n$ optimises the compensation matrix $W_n$.

The relative gradient matrix $H_n$ is diagonally symmetric, which means that the second relative gradient coefficient $H_{1,2}$ is equal to a third relative gradient coefficient $H_{2,1}$, i.e. $H_{1,2} = H_{2,1}$, and these coefficients can be determined in a single operation. Generation of the relative gradient matrix $H_n$ by the relative gradient generation stage 214 can therefore be expressed more specifically as $$H_{1,1} = c_n \cdot Y_{1,n}^2 - 1$$

$$H_{1,2} = H_{2,1} = c_n \cdot Y_{1,n} \cdot Y_{2,n}$$

$$H_{2,2} = c_n \cdot Y_{2,n}^2 - 1 \qquad (6)$$

The step parameter generation stage 224 generates the step parameter $\mu_n$ using $$\mu_n = \mu_{n-1}(\alpha - \beta \operatorname{trace}(H_n G_n)) \qquad (7)$$

where $\alpha$ is a first constant, in this embodiment having a value of 997 thousandths, i.e. $\alpha = 0.997$, $\beta$ is a second constant, in this embodiment having a value of two to the power of minus twenty three, i.e. $\beta = 2^{-23}$, and $G_n$ is an update function matrix of first, second, third and fourth update function parameters $G_{1,1}$, $G_{1,2}$, $G_{2,1}$ and $G_{2,2}$ in the form $$G_n = \begin{bmatrix} G_{1,1} & G_{1,2} \\ G_{2,1} & G_{2,2} \end{bmatrix},$$

defined by $$G_n = (I_2 - \mu_{n-1} H_n) G_{n-1} - H_n W_{n-1} - 2\mu_{n-1} G_{n-1}(H_n + I_2) \qquad (8)$$

The update function matrix $G_n$ is an expression of the rate of change of the compensation matrix $W_n$ with the step parameter $\mu_n$. By incorporating the update function matrix $G_n$ in the generation of the step parameter $\mu_n$ based on equation (6), the step parameter $\mu_n$ is made adaptive. Specifically, variations in the rate of change of the compensation matrix $W_n$ with the step parameter $\mu_n$ cause the magnitude of the step parameter $\mu_n$ to change.

The structure of equation (7), by which the step parameter $\mu_{n-1}$, adjusted using the second constant $\beta$ and the trace function, is subtracted from the same step parameter $\mu_{n-1}$ adjusted using the first constant $\alpha$, provides a forgetting factor to smooth changes in the value of the step parameter $\mu_n$.

Although the first constant $\alpha$ is described as having a value of 997 thousandths, i.e. $\alpha = 0.997$, and the second constant $\beta$ is described as having a value of two to the power of minus twenty three, i.e. $\beta = 2^{-23}$, these values are not essential. Rather, the values can be optimised for a particular implementation. Typically, in most implementations, the first constant $\alpha$ has a value of in the order of thousandths less than 1, and the second constant $\beta$ has a value between two to the power of minus twenty to two to the power of minus twenty five.

In order to generate the step parameter $\mu_n$, the step parameter generation stage 224 first determines the update function matrix $G_n$ based on equation (8). In order to do this, it is useful to define, as a intermediate step, an update matrix $Up_n$, in the form $$Up = \begin{bmatrix} Up_{1,1} & Up_{1,2} \\ Up_{2,1} & Up_{2,2} \end{bmatrix},$$

where $Up_{1,1}$, $Up_{1,2}$, $Up_{2,1}$ and $Up_{2,2}$ are first, second, third and fourth update coefficients defined by $$Up_{1,1} = 1 - \mu H_{1,1}$$

$$Up_{1,2} = Up_{2,1} = -\mu H_{1,2}$$

$$Up_{2,2} = 1 - \mu H_{2,2} \qquad (9)$$

This allows the update function matrix $G_n$ determined by the step parameter generation stage 224 to be expressed more specifically as $$G_{1,1} = Up_{1,1} \cdot G_{1,1} + Up_{1,2} \cdot G_{2,1} - H_{1,1} \cdot W_{1,1} - H_{1,2} \cdot W_{2,1} - 2\mu(G_{1,1}(H_{1,1}+1) + G_{1,2} H_{1,2})$$

$$G_{1,2} = Up_{1,1} \cdot G_{1,2} + Up_{1,2} \cdot G_{2,2} - H_{1,1} \cdot W_{1,2} - H_{1,2} \cdot W_{2,2} - 2\mu(G_{1,1} \cdot H_{1,1} + G_{1,2}(H_{2,2}+1))$$

$$G_{2,1} = Up_{1,2} \cdot G_{1,1} + Up_{2,2} \cdot G_{2,1} - H_{1,2} \cdot W_{1,1} - H_{2,2} \cdot W_{2,1} - 2\mu(G_{2,1}(H_{1,1}+1) + G_{2,2} H_{1,2})$$

$$G_{2,2} = Up_{1,2} \cdot G_{1,2} + Up_{2,2} \cdot G_{2,2} - H_{1,2} \cdot W_{1,2} - H_{2,2} \cdot W_{2,2} - 2\mu(G_{2,1} \cdot H_{1,2} + G_{2,2}(H_{2,2}+1)) \qquad (10)$$

With the first, second, third and fourth update function parameters $G_{1,1}$, $G_{1,2}$, $G_{2,1}$ and $G_{2,2}$ determined, the step parameter generation stage 224 determines the step parameter $\mu_n$ based on equation (7). Generation of the step parameter $\mu_n$ by the step parameter generation stage 224 can be expressed more specifically as $$\mu = \mu \cdot \{\alpha - \beta [H_{1,1} \cdot G_{1,1} + H_{1,2} \cdot (G_{2,1} + G_{1,2}) + H_{2,2} \cdot G_{2,2}]\} \qquad (11)$$

The compensation coefficient generation stage 200 uses the step parameter $\mu_n$ and the first, second and fourth relative gradient coefficients $H_{1,1}$, $H_{1,2}$, $H_{2,2}$ to generate the first, second, third and fourth compensation coefficients $W_{1,1}$, $W_{1,2}$, $W_{2,1}$, $W_{2,2}$ based on equation (4). Again, it is useful to perform this generation using an intermediate step based on the first, second, third and fourth update coefficients $Up_{1,1}$, $Up_{1,2}$, $Up_{2,1}$, $Up_{2,2}$ of the update matrix $Up_n$, so that $$W_{1,1} = Up_{1,1} \cdot W_{1,1} + Up_{1,2} \cdot W_{2,1}$$

$$W_{1,2} = Up_{1,1} \cdot W_{1,2} + Up_{1,2} \cdot W_{2,2}$$

$$W_{2,1} = Up_{1,2} \cdot W_{1,1} + Up_{2,2} \cdot W_{2,1}$$

$$W_{2,2} = Up_{1,2} \cdot W_{1,2} + Up_{2,2} \cdot W_{2,2} \qquad (12)$$

In this embodiment, the gain control parameter $c_n$ for time n is generated by the gain control stage 208 using $$c_n = 2^{-b_n} \qquad (13)$$

where a first gain control value $a_n$ at time n is defined by $$a_n = a_{n-1} + \lambda(\|X_n\|^2 - a_{n-1}) \qquad (14)$$

and a second gain control value $b_n$ at time n is defined by $$b_n = \operatorname{round}(\log_2 a_n) \qquad (15)$$

where $\|\ \|$ denotes a norm and $\lambda$ is a smoothing factor, which in this embodiment is equal to one ten thousandth, i.e. $\lambda=0.0001$. By referring to the levels $X_{1,n}$, $X_{2,n}$ of the digital I-path signal $x_I(t)$ and the digital Q-path signal $x_Q(t)$ instead of the uncompensated signal matrix $X_n$, determination of the first gain control value $a_n$ can be expressed more specifically as $$a_n = a_{n-1} + \lambda(X_{1,n}^2 + X_{2,n}^2 - a_{n-1}) \tag{16}$$

In order to determine the gain control parameter $c_n$, the gain control stage 208 determines the first gain control value $a_n$ at the time n using equation (14) or (16). With the first gain control value $a_n$ at the time n determined, the gain control stage 208 determines the second gain control value $b_n$ and the gain control parameter $c_n$, using equations (13) and (15). For simplicity, the $\log_2$ operation in equation (15) is simplified by finding the power of two closest to the gain control value $a_n$, rather than performing the $\log_2$ operation in full. Also, the operation defined in equation (13) is implemented as a right shift by a number of bits equal to the second gain control value $b_n$. Once determined, the gain control parameter $c_n$ is delivered to output 213 of the gain control stage 208.

As the level of first gain control value $a_n$ at the time n depends on the level of the first gain control value $a_{n-1}$ at the preceding time n−1, the level is determined iteratively. Moreover, on start-up of the process, it can take a number of iterations for an accurate level to be arrived at. For this reason, when the compensation stage 124 begins operation, the gain control stage 208 is run for a period of time N before compensation of the digital I-path signal $x_I(t)$ and the digital Q-path signal $x_Q(t)$ begins. At the beginning of this period of time, the gain control stage 208 sets the first gain control value $a_{n-1}$ at zero, i.e. $a_{n-1}=0$. Optionally, the smoothing factor $\lambda$ is also set at a different, higher value. In this embodiment, the smoothing factor $\lambda$ is set at three tenths, i.e. $\lambda=0.3$. During the period of time N, the compensation matrix $W_n$, the update function matrix $G_n$ and the step parameter $\mu_n$ are held constant. In this embodiment, the constant compensation matrix $W_n$, update function matrix $G_n$ and step parameter $\mu_n$ are $$W_{-1} = \begin{bmatrix} 1 & 0 \\ 0 & 1 \end{bmatrix} \tag{17}$$

$$G_{-1} = \begin{bmatrix} 0 & 0 \\ 0 & 0 \end{bmatrix}$$

$$\mu_{-1} = 2^{-6}$$

Although the smoothing factor $\lambda$ is described as having an initial value of 0.3 and a normal value of one ten thousandth, these values are not essential. Rather, the values can be optimised for a particular implementation. Typically, in most implementations, the smoothing factor $\lambda$ has an initial value in the order of tenths, and a normal value in the order of ten thousandths. Similarly, the constant value of the step parameter $\mu_{-1}$ used during start up need not be $2^{-6}$. Rather, it is typically of the order of millionths.

In another embodiment, the gain control parameter $c_n$ is determined as the inverse of the first gain control value $a_n$.

In yet another embodiment, the step function $\mu_n$ given in equation (7) above is replaced by $$\mu_n = \mu_{n-1} + \beta(\eta - \gamma\mu_{n-1}) \tag{18}$$

where $$\eta = \mu_{n-1}(\mu_{n-1} - \alpha \operatorname{trace}(H_n G_n)) \tag{19}$$

In this embodiment, the first constant $\alpha$ has a value of one ten thousandth, i.e. $\alpha=10^{-4}$ and the second constant $\beta$ has a value of one hundredth, i.e. $\beta=10^{-2}$, and a third constant $\gamma$ has a value of 95 hundredths, i.e. $\gamma=0.95$. However, as before, these values are not essential, and the first constant $\alpha$ typically has a value in the order of ten thousandths, the second constant $\beta$ has a value in the order of hundredths, and the third constant $\gamma$ has a value of hundredths less than one.

Updating the step function $\mu_n$ using equations (18) and (19) instead of equation (7) provides different convergence properties. In particular, the compensation coefficients $W_{1,1}$, $W_{1,2}$, $W_{2,1}$, $W_{2,2}$ tend to converge more quickly, but are slightly less stable during periods when the phase error $\phi$ and gain error g do not change significantly.

Other variations and modifications will be apparent to the skilled person. Such variations and modifications may involve equivalent and other features that are already known and which may be used instead of, or in addition to, features described herein. Features that are described in the context of separate embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A receiver for receiving a signal, the receiver comprising:
   a local oscillator arranged to deliver an in-phase local oscillator signal and a quadrature local oscillator signal;
   an in-phase signal path having a mixer arranged to mix the signal received by the receiver with the in-phase local oscillator signal to deliver an in-phase signal, and an analogue-to-digital converter arranged to convert the in-phase signal to a digital in-phase signal; and
   a quadrature signal path having a mixer arranged to mix the signal received by the receiver with the quadrature local oscillator signal to deliver a quadrature signal, and an analogue-to-digital converter arranged to convert the quadrature signal to a digital quadrature signal;
   a compensation stage arranged to deliver a compensated digital in-phase signal and a compensated digital quadrature signal by applying compensation coefficients to the digital in-phase signal and the digital quadrature signal; and
   a compensation coefficient generator arranged to generate the compensation coefficients by iteratively updating them using a relative gradient of the compensated digital in-phase signal and the compensated digital quadrature signal, and a step parameter,
   wherein the compensation stage is arranged to adjust a magnitude of the step parameter based on the relative gradient of the compensated digital in-phase signal and the compensated digital quadrature signal and a rate of change of the compensation coefficients.

2. The receiver of claim 1, wherein the compensation stage is arranged to adjust the magnitude of the step parameter based on the rate of change of the compensation coefficients with the magnitude of the step parameter.

3. The receiver of claim 1, wherein the compensation stage is arranged to adjust the magnitude of the step parameter based on a trace function of a first matrix of the rate of change of the compensation coefficients with the magnitude of the step parameter and a second matrix of the relative gradient of the compensated digital in-phase signal and the compensated digital quadrature signal.

4. The receiver of claim 3, wherein the compensation stage is arranged to adjust the magnitude of the step parameter based on $$\mu_n = \mu_{n-1}(\alpha - \beta \text{trace}(H_n G_n))$$

where $\mu_{n-1}$ is the magnitude of the step parameter, $\mu_n$ is the adjusted magnitude of the step parameter, $G_n$ is the first matrix, $H_n$ is the second matrix, n is a time index, and $\alpha$ and $\beta$ are constants.

5. The receiver of claim 3, wherein the compensation stage is arranged to adjust the magnitude of the step parameter based on $$\mu_n = \mu_{n-1} + \beta(\eta - \gamma \mu_{n-1})$$

where $$\eta = \mu_{n-1}(\mu_{n-1} - \alpha \text{trace}(H_n G_n))$$

$\mu_{n-1}$ is the magnitude of the step parameter, $\mu_n$ is the adjusted magnitude of the step parameter, $G_n$ is the first matrix, $H_n$ is the second matrix, n is a time index, and $\alpha$, $\beta$ and $\gamma$ are constants.

6. The receiver of claim 1, further comprising a gain controller arranged to generate a gain control parameter and a relative gradient generation stage arranged to generate the relative gradient based on the gain control parameter, the compensated digital in-phase signal and the compensated digital quadrature signal.

7. The receiver of claim 6, wherein the relative gradient generation stage is arranged to generate the relative gradient based on $$H_n = c_n Y_n \cdot Y_n^t - I_2$$

where $H_n$ is a relative gradient matrix, $c_n$ is the gain control parameter, $Y_n$ is a matrix of the compensated digital in-phase signal and the compensated digital quadrature signal at a time n, $Y_n^t$ is the transpose of $Y_n$ and $I_2$ is an identity matrix.

8. The receiver of claim 6, wherein the gain controller is arranged to generate the gain control parameter based on the uncompensated digital in-phase signal and the uncompensated digital quadrature signal.

9. The receiver of claim 6, wherein the gain control parameter has a value that normalizes the compensated digital in-phase signal and the compensated digital quadrature signal.

10. The receiver of claim 6, wherein the gain controller is arranged to generate the gain control parameter based on $$c_n = 2^{-b_n}$$

where $b_n$ is a gain control value defined by $$b_n = \text{round}(\log_2 a_n)$$

and $a_n$ is another gain control value defined by $$a_n = a_{n-1} + \lambda(\|X_n\|^2 - a_{n-1})$$

where $X_n$ is a matrix of the uncompensated digital in-phase signal and the uncompensated digital quadrature signal at time n, $\|\ \|0$ denotes a norm and $\lambda$ is a smoothing factor.

11. The receiver of claim 1, wherein the compensation coefficients generated by the compensation coefficient generator comprise a first compensation coefficient, a second compensation coefficient, a third compensation coefficient and a fourth compensation coefficient, and the compensation stage is arranged to generate a first signal and a third signal by multiplying the digital in-phase signal with the first compensation coefficient and the third compensation coefficient respectively, to generate a second signal and a fourth signal by multiplying the digital quadrature signal with the second compensation coefficient and the fourth compensation coefficient respectively, to sum the first signal and the second signal to output the compensated digital in-phase signal, and to sum the third signal and the fourth signal to output the compensated digital quadrature signal.

12. A communication device incorporating the receiver of claim 1.

13. A method comprising:
receiving a signal;
delivering an in-phase local oscillator signal and a quadrature local oscillator signal;
in an in-phase signal path, mixing the received signal with the in-phase local oscillator signal to deliver an in-phase signal and converting the in-phase signal to a digital in-phase signal; and
in a quadrature signal path, mixing the received signal with the quadrature local oscillator signal to deliver a quadrature signal and converting the quadrature signal to a digital quadrature signal;
applying compensation coefficients to the digital in-phase signal and the digital quadrature signal to deliver a compensated digital in-phase signal and a compensated digital quadrature signal;
generating the compensation coefficients by iteratively updating them using a relative gradient of the compensated digital in-phase signal and the compensated digital quadrature signal, and a step parameter;
adjusting a magnitude of the step parameter based on the relative gradient of the compensated digital in-phase signal and the compensated digital quadrature signal and a rate of change of the compensation coefficients.

14. A non-transitory computer readable medium carrying computer program code arranged to carry out the method of claim 13 when executed by a processor.

* * * * *